US008163460B2

(12) United States Patent
Takei et al.

(10) Patent No.: US 8,163,460 B2
(45) Date of Patent: Apr. 24, 2012

(54) UNDERLAYER COATING FORMING COMPOSITION FOR LITHOGRAPHY CONTAINING POLYSILANE COMPOUND

(75) Inventors: Satoshi Takei, Toyoma (JP); Keisuke Hashimoto, Toyama (JP); Makoto Nakajima, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 880 days.

(21) Appl. No.: 11/920,840

(22) PCT Filed: May 12, 2006

(86) PCT No.: PCT/JP2006/309576
§ 371 (c)(1),
(2), (4) Date: Apr. 9, 2008

(87) PCT Pub. No.: WO2006/126406
PCT Pub. Date: Nov. 30, 2006

(65) Prior Publication Data
US 2008/0318158 A1 Dec. 25, 2008

(30) Foreign Application Priority Data
May 24, 2005 (JP) ................................. 2005-150420

(51) Int. Cl.
G03F 7/004 (2006.01)
G03F 7/075 (2006.01)
G03F 7/26 (2006.01)

(52) U.S. Cl. ................. 430/270.1; 430/272.1; 430/322; 430/927

(58) Field of Classification Search ............... 430/270.1, 430/272.1, 322, 913, 921, 927
See application file for complete search history.

(56) References Cited

U.S. PATENT DOCUMENTS

| 6,025,117 | A  | * | 2/2000 | Nakano et al. ................. 430/314 |
| 6,270,948 | B1 |   | 8/2001 | Sato et al. |
| 2005/0008964 | A1 | * | 1/2005 | Takei et al. ................. 430/270.1 |
| 2005/0031964 | A1 |   | 2/2005 | Babich et al. |
| 2005/0074689 | A1 |   | 4/2005 | Angelopoulos et al. |

FOREIGN PATENT DOCUMENTS

| JP | A 10-209134   | 8/1998  |
| JP | A 10-268526   | 10/1998 |
| JP | A 11-258813   | 9/1999  |
| JP | A 2001-53068  | 2/2001  |
| JP | A 2001-55512  | 2/2001  |
| JP | A 2002-47430  | 2/2002  |
| JP | A 2002-107938 | 4/2002  |
| JP | A 2002-128847 | 5/2002  |
| JP | A 2004-309561 | 11/2004 |
| JP | A 2005-15779  | 1/2005  |
| JP | A 2005-48152  | 2/2005  |
| JP | A 2005-55893  | 3/2005  |
| JP | A 2005-115380 | 4/2005  |
| WO | WO 02/05035 A1 | 1/2002 |

* cited by examiner

*Primary Examiner* — Anca Eoff
(74) *Attorney, Agent, or Firm* — Oliff & Berridge, PLC

(57) ABSTRACT

There is provided an underlayer coating for lithography that is used in lithography process of the manufacture of semiconductor devices, that can be used as a hardmask, and that causes no intermixing with photoresists; and a composition for forming the underlayer coating.

The composition comprises a polysilane compound, a crosslinkable compound, a crosslinking catalyst and a solvent. The polysilane compound is preferably a polysilane compound having a bond between silicons at the main chain.

6 Claims, No Drawings

UNDERLAYER COATING FORMING COMPOSITION FOR LITHOGRAPHY CONTAINING POLYSILANE COMPOUND

TECHNICAL FIELD

The present invention relates to a composition for forming an underlayer coating between a semiconductor substrate and a photoresist that is used for the manufacture of semiconductor devices. Specifically, the present invention relates to an underlayer coating forming composition for lithography for forming an underlayer coating used as an underlayer of a photoresist in a lithography process of the manufacture of semiconductor devices. The present invention also relates to a method for forming a photoresist pattern by use of the underlayer coating forming composition.

BACKGROUND ART

Conventionally, in the manufacture of semiconductor devices, micro-processing by lithography using a photoresist has been carried out. The micro-processing is a processing method comprising forming a thin coating of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective coating, thereby forming fine unevenness corresponding to the pattern on the surface of the substrate. In recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of reflection actinic rays from a substrate have become serious problems. Accordingly, it has been widely studied to provide an anti-reflective coating between the photoresist and the substrate (bottom anti-reflective coating) in order to resolve the problem. As the anti-reflective coating, from a viewpoint of easy of use or the like, many considerations have been done on organic anti-reflective coatings composed of polymers having light absorbing group, etc. For example, the organic anti-reflective coatings include an acrylic resin type anti-reflective coating having hydroxy group being crosslinking reaction group and a light absorbing group in the same molecule, or a novolak resin type anti-reflective coating having hydroxy group being crosslinking reaction group and a light absorbing group in the same molecule. The properties desired for such an anti-reflective coating include high absorbance to light and radioactive rays, no intermixing with the photoresist (being insoluble in photoresist solvents), no diffusion of low molecular substances from the anti-reflective coating into the topcoat photoresist upon baking under heating, and a higher dry etching rate than the photoresist, etc.

In recent years, in order to solve interconnection delay that has become clear with miniaturization in pattern rule of semiconductor devices, it has been also considered to use copper as interconnect material, and to apply Dual Damascene process as interconnect forming method on the semiconductor substrate. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like. However, it is difficult to apply organic material for anti-reflective coating on a substrate having a high aspect ratio, and in recent years, material with particular emphasis on filling property or flattening property has been developed (see, for example Patent Documents 1 and 2).

In addition, in the production of devices such as semiconductor devices, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example Patent Document 3). Further, in recent years, as an underlayer coating between a semiconductor substrate and a photoresist, a coating known as a hardmask that contains a metal element such as silicon or titanium, etc. has been used (see, for example Patent Documents 4, 5, 6 and 7). In this case, as the photoresist and the hardmask are largely different from each other in the constituent components, rates at which the components are removed by dry etching depend largely on the kind of gas used for dry etching. An appropriate selection of the kind of gas makes possible to remove the hardmask by dry etching without significant decrease in film thickness of the photoresist. Therefore, in case where a photoresist and a hardmask are used, it is assumed that a film thickness sufficient for a protective coating (composed of a photoresist and a hardmask) for semiconductor substrate processing can be ensured even when the photoresist is a thin coating.

As mentioned above, in the recent manufacture of semiconductor devices, in order to exert several effects in addition to anti-reflective effect, it is getting larger that an underlayer coating is provided between a semiconductor substrate and a photoresist. Although the compositions for the underlayer coatings have been considered, it is desired to develop novel materials for underlayer coatings from the diversity of characteristics required therefor and the like.

On the other hand, a composition and a method for forming a pattern in which a compound having a bond between one silicon and another silicon (silicons) is used are known (see, for example Patent Documents 8, 9, 10, 11 and 12).

An anti-reflective layer forming composition comprising a polymer containing a novolak-like silane is disclosed. The polymer contains a novolak group at the main chain and a cluster-like silane at the side chain. The composition can comprise an acid generator and a crosslinking compound (see, for example Patent Document 13).

Patent Document 1: JP-A 2002-47430
Patent Document 2: WO 02/05035 pamphlet
Patent Document 3: JP-A 2002-128847
Patent Document 4: JP-A 11-258813
Patent Document 5: JP-A 2001-53068
Patent Document 6: JP-A 2005-55893
Patent Document 7: JP-A 2005-15779
Patent Document 8: JP-A 10-209134
Patent Document 9: JP-A 2001-55512
Patent Document 10: JP-A 10-268526
Patent Document 11: JP-A 2005-48152
Patent Document 12: JP-A 2002-107938
Patent Document 13: JP-A 2005-115380

DISCLOSURE OF INVENTION

Problems to be Solved by the Invention

An object of the present invention is to provide an underlayer coating forming composition for lithography that can be used for the manufacture of semiconductor devices, and specifically to provide an underlayer coating forming composition for lithography for forming an underlayer coating that can be used as a hardmask. Another object is to provide an underlayer coating forming composition for lithography for forming an underlayer coating that can be used as an antireflective coating. Further, an object is to provide an underlayer coating for lithography that causes no intermixing with a photoresist and that has a high dry etching rate compared with the photoresist, and an underlayer coating forming composition for forming the underlayer coating. Also, an object of the present invention is to provide a method for forming a photoresist pattern in which the underlayer coating forming composition for lithography is used.

Means for Solving the Problem

Taking the above-mentioned present status into account, the present inventors eagerly investigated, and as a result, they found that an excellent underlayer coating can be formed from a composition containing a polysilane compound having a bond between silicons at the main chain, and they completed the present invention.

The present invention relates to the following aspects:
as a first aspect, an underlayer coating forming composition for lithography that is used in a lithography process of manufacture of semiconductor device, comprising a polysilane compound, a crosslinkable compound, a crosslinking catalyst and a solvent;
as a second aspect, the underlayer coating forming composition for lithography according to the first aspect, wherein the polysilane compound is a polysilane compound having a bond between silicons at the main chain;
as a third aspect, the underlayer coating forming composition for lithography according to the first aspect, wherein the polysilane compound is a polysilane compound having a structural unit of formula (1):

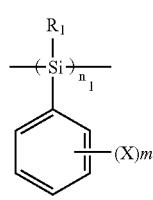

(1)

wherein $R_1$ is hydrogen atom or $C_{1-10}$alkyl, X is $C_{1-10}$alkyl, $C_{1-10}$alkoxy, $C_{7-15}$aralkyl, $C_{6-14}$aryl, $C_{7-15}$aryloxyalkyl, hydroxy, $C_{2-10}$alkenyl, or $C_{2-10}$alkoxyalkyl, $n_1$ is a number of repeating units ranging from 40 to 200, m is an integer of 1 to 5, when m is 2 to 5, Xs are identical with or different from each other;
as a fourth aspect, the underlayer coating forming composition for lithography according to the first aspect, wherein the polysilane compound is a polysilane compound having structural units of formulae (1) and (2):

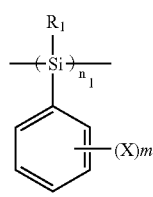

(1)

(2)

wherein X and m are as defined above, $n_1$ and $n_2$ are numbers of repeating units, both $n_1$ and $n_2$ are integers of 1 or more, $n_1+n_2$ is 40 to 200, $R_2$ is hydrogen atom or $C_{1-10}$alkyl, A is $C_{1-10}$alkylene;
as a fifth aspect, the underlayer coating forming composition for lithography according to the first aspect, wherein the polysilane compound is a polysilane compound having a structural unit of formula (3):

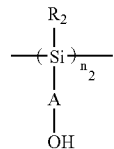

(3)

wherein $n_1$ is a number of repeating units ranging from 40 to 200, $R_3$ is substituted or unsubstituted $C_{1-10}$alkyl, or substituted or unsubstituted cycloalkyl, or a combination thereof;
as a sixth aspect, the underlayer coating forming composition for lithography according to the fifth aspect, wherein the polysilane compound of formula (3) is a compound containing $R_3$ being substituted or unsubstituted cycloalkyl in a proportion of 20 mol % or more in all of $R_3$;
as a seventh aspect, the underlayer coating forming composition for lithography according to any one of the first to sixth aspects, wherein the crosslinkable compound is a nitrogen-containing compound having two or more nitrogen atoms substituted with hydroxymethyl or alkoxymethyl;
as an eighth aspect, the underlayer coating forming composition for lithography according to any one of the first to seventh aspects, wherein the crosslinking catalyst is an aromatic sulfonic acid compound;
as a ninth aspect, the underlayer coating forming composition for lithography according to any one of the first to eighth aspects, further comprising a photoacid generator;
as a tenth aspect, an underlayer coating formed by coating the underlayer coating forming composition for lithography according to any one of the first to ninth aspects on a substrate for use in manufacture of semiconductor device, and baking it at 150 to 250° C. for 0.5 to 2 minutes;
as an eleventh aspect, a method for forming photoresist pattern for use in manufacture of semiconductor device, comprising the steps: coating the underlayer coating forming composition for lithography according to any one of the first to ninth aspects on a substrate for use in manufacture of semiconductor device, and baking it to form an underlayer coating; forming a photoresist layer on the underlayer coating; exposing the substrate covered with the underlayer coating and the photoresist layer to light; and developing after the exposure to light; and
as a twelfth aspect, the method for forming photoresist pattern according to the eleventh aspect, wherein the exposure to light is performed with ArF excimer laser beam (wavelength 193 nm).

Effect of the Invention

The underlayer coating forming composition for lithography of the present invention can provide an underlayer coating that cause no intermixing with photoresists and acts as an anti-reflective coating by effectively absorbing light reflected from substrates, in the micro-processing with KrF excimer laser beam (wavelength 248 nm) and ArF excimer laser beam (wavelength 193 nm), etc. In addition, the underlayer coating forming composition of the present invention can provide an excellent underlayer coating that has a high dry etching rate compared with photoresists.

Further, the use of the underlayer coating forming composition for lithography of the present invention enables the formation of photoresist pattern having a good shape.

BEST MODE FOR CARRYING OUT THE INVENTION

The underlayer coating forming composition for lithography of the present invention comprises a polysilane compound having a bond between silicons at the main chain, a crosslinkable compound, a crosslinking catalyst and a solvent. In addition, the underlayer coating forming composition of the present invention can contain a polymer compound, a photoacid generator and a surfactant and so on.

The proportion of the solid content in the underlayer coating forming composition of the present invention is not specifically limited so long as each component is dissolved homogeneously and is for example 0.5 to 50 mass %, or 5 to 40 mass %, or 10 to 30 mass %. In this specification, the solid content means all components in the underlayer coating forming composition for lithography from which the solvent component is excluded.

The content proportion of the polysilane compound having a bond between silicons at the main chain, the crosslinkable compound and the crosslinking catalyst in the underlayer coating forming composition for lithography of the present invention is as follows: based on 100 mass parts of the polysilane compound having a bond between silicons at the main chain, the content of the crosslinkable compound is 1 to 50 mass parts, or 5 to 40 mass parts, or 10 to 30 mass parts, and the content of the crosslinking catalyst is 0.1 to 10 mass parts, or 0.5 to 5 mass parts, or 1 to 3 mass parts.

Hereinafter, the underlayer coating forming composition for lithography of the present invention will be described concretely.

The polysilane compound having a bond between silicons at the main chain contained in the underlayer coating forming composition for lithography of the present invention is not specifically limited. Linear, cyclic, branched or reticulate compounds having a bond between silicons can be used.

As the polysilane compound, for example, the polysilane compounds having at least one of structural units of formulae (4) to (6) can be used.

(4)

(5)

(6)

The polysilane compounds are compounds having a bond between silicons, for example linear or cyclic polysilane compounds having the structural unit of formula (4), branched or reticulate polysilane compounds having the structural unit of formula (5) or (6), and polysilane compounds having a combination of the structural units of formulae (4) to (6).

In formulae (4) to (6), $R_{10}$, $R_{11}$ and $R_{12}$ independently of one another are hydrogen atom, hydroxy, $C_{1-20}$alkyl, $C_{2-20}$alkenyl, $C_{7-15}$aralkyl, $C_{6-14}$aryl, $C_{4-10}$alicyclic group, $C_{7-15}$aryloxyalkyl, $C_{1-20}$alkoxy or $C_{2-10}$alkoxyalkyl.

The alkyl includes methyl, ethyl, n-pentyl, n-decyl, n-octadecyl, cyclohexyl, isopropyl and 2-ethylhexyl, etc. The alkenyl includes vinyl, 2-propenyl, cyclohexenyl and 2-butenyl, etc. The aralkyl includes benzyl, 2-phenylethyl, 1-naphthylmethyl and 9-anthrylmethyl, etc. The alicyclic group includes cyclobutyl, cyclohexyl and cyclooctyl, etc. The aryl includes phenyl, 1-naphthyl, 2-naphthyl, 1-anthryl and 9-anthryl, etc. The aryloxyalkyl includes phenoxymethyl, phenoxyethyl, 1-naphthyloxymethyl and 9-anthryloxymethyl, etc.

The alkoxy includes methoxy, ethyoxy, n-pentyloxy, n-decyloxy, n-octadecyloxy, cyclohexyloxy, cyclodecyloxy, i-propoxy and 2-ethylhexyloxy, etc. The alkoxyalkyl includes methoxymethyl, methoxypropyl, ethoxymethyl, i-propoxymethyl and cyclohexyloxymethyl, etc.

The above-mentioned alkyl, alkenyl, aralkyl, aryl and alicyclic group may be substituted with substituents such as $C_{1-10}$alkyl, $C_{1-10}$alkoxy, $C_{7-15}$aralkyl, $C_{6-14}$aryl, $C_{4-10}$alicyclic group, $C_{7-15}$aryloxyalkyl, hydroxy, $C_{2-10}$alkeny or $C_{2-10}$alkoxyalkyl.

The above-mentioned polysilane compound can be produced according to any conventional methods. The methods for producing the polysilane compound include for example the following ones: a method of subjecting silicon-containing monomers having specific structural units being starting material and a halosilane to dehalogenative polycondensation in the presence of an alkali metal ("Kipping Method", J. Am. Chem. Soc., Vol. 110, p. 124 (1988), Macromolecules, Vol. 23, p. 3423 (1990), etc.), a method of subjecting a halosilane to dehalogenative polycondensation with electrode reduction (J. Chem. Soc., Chem. Commun., p. 1161 (1990), J. Chem. Soc., Chem. Commun., p. 897 (1992), etc.), a method of subjecting a halosilane to dehalogenative polycondensation by use of magnesium as a reductant ("Magnesium Reduction Method", WO 98/29476, etc.), a method of subjecting a hydrazine to dehydrogenative polycondensation in the presence of a metal catalyst (JP-A 4-334551, etc.), a method by anion polymerization of disilenes crosslinked with biphenyl or the like (Macromolecules, Vol. 23, p. 4494 (1990), etc.), a method by ring-opening polymerization of cyclic silanes, and so on. Further, there are for example a method in which dihalosilanes are condensed by using sodium as an alkali metal and toluene as a solvent with irradiating ultrasonic wave (JP-A 62-241926), a method in which dihalosilanes are condensed by using lithium as an alkali metal and tetrahydrofuran as a solvent (JP-A 56-123993), a method in which an alkali metal is reacted with a halosilane in the presence of a specific metal halide in an aprotic solvent (JP-A 10-182834, JP-A 10-287748), and so on. For example, in the above-mentioned method ("Kipping Method") in which a halosilane is subjected to dehalogenative polycondensation in the presence of alkali metal, polysilane compounds having hydroxy can be produced by applying a method in which water is added at the conclusion of polycondensation reaction.

As the polysilane compound contained in the underlayer coating forming composition for lithography of the present invention, polysilane compounds having a bond between silicons at the main chain are used. The polysilane compounds having a bond between silicons at the main chain belong to linear polysilane compounds fundamentally composed of the structural units of formula (4).

The linear polysilane compound contained in the underlayer coating forming composition for lithography of the present invention has a two-dimensional structure and the polysilane compounds having the structural units of formula (1) can be used.

In formula (1), $R_1$ is hydrogen atom or $C_{1-10}$alkyl, X is $C_{1-10}$alkyl, $C_{1-10}$alkoxy, $C_{7-15}$aralkyl, $C_{6-14}$aryl, $C_{7-15}$aryloxyalkyl, hydroxy, $C_{2-10}$alkenyl, or $C_{2-10}$alkoxyalkyl, and n is an integer of 1 to 5, when n is 2 to 5, Xs are identical with or different from each other. In the meantime, when n is 1 to 4, the benzene ring has (5-n) hydrogen atoms.

The $C_{1-10}$alkyl includes for example methyl, ethyl, n-hexyl, n-decyl, i-propyl, tert-butyl, cyclopentyl and adamantyl, etc.

The $C_{1-10}$alkoxy includes for example methoxy, ethoxy, n-hexyloxy, n-decyloxy, i-propoxy, tert-butoxy, cyclopentyloxy and adamantyloxy, etc.

The $C_{7-15}$aralkyl includes for example benzyl, 2-phenylethyl, 1-naphthylmethyl and 9-anthrylmethyl, etc.

The $C_{6-14}$aryl includes for example phenyl, 1-naphthyl, 2-naphthyl, 1-anthryl and 9-anthryl, etc.

The $C_{7-15}$aryloxyalkyl includes for example phenoxymethyl, phenoxyethyl, 1-naphthyloxymethyl and 9-anthryloxymethyl, etc.

The $C_{2-10}$alkenyl includes for example vinyl, 2-propenyl, cyclohexenyl and 2-butenyl, etc.

The $C_{2-10}$alkoxyalkyl includes for example methoxymethyl, methoxypropyl, ethoxymethyl, i-propoxymethyl and cyclohexyloxymethyl, etc.

The polysilane compound having the structural units of formula (1) can be produced from dihalosilane compounds such as phenylhydrogen dichlorosilane, hydroxyphenylhydrogen dichlorosilane, methylphenyl dichlorosilane, ethylphenyl dichlorosilane, i-propylphenyl dichlorosilane, octylphenyl dichlorosilane, methyltolyl dichlorosilane, methylhydroxyphenyl dichlorosilane, methylbenzyl dichlorosilane, methylphenylethyl dichlorosilane, methylmethoxymethylated phenyl dichlorosilane, or the like. These dihalosilane compounds correspond to the structural units of formula (1), and thus the structural units of formula (1) is introduced into the polysilane compound by them. For the production of the polysilane compound, these silane compounds can be in only one kind or in a combination of two or more kinds. Further, in addition to these silane compounds, other silane compounds that can be used for the production of the polysilane compound can be used. For example, silane compounds such as dichlorosilylene, dimethylchlorosilane or the like are copolymerized and can be used. It is assumed that the end part of the resulting polysilane compound becomes a state where hydroxy is bonded to silicon atom, that is, silanol structure (Si—OH). This silanol participates in crosslinking reaction with a crosslinkable compound.

As the compound having a two-dimensional structure in the polysilane compound contained in the underlayer coating forming composition for lithography of the present invention, polysilane compounds having a combination of the structural units of formulae (1) and (2) can be used. In formula (2), $R_2$ is $C_{1-10}$alkyl, A is $C_{1-10}$alkylene. $R_2$ being $C_{1-10}$alkyl includes for example methyl, ethyl, n-hexyl, n-decyl, i-propyl, tert-butyl, cyclopentyl and adamantyl, etc. A being $C_{1-10}$alkylene includes for example methylene, ethylene, n-butylene, n-octylene, 1-methylethylene, 2-methylpropylene and cyclohexylene, etc. The hydroxy in formula (2) participates in crosslinking bond formation with a crosslinkable compound.

The polysilane compound having the structural units of formulae (1) and (2) can be produced from dihalosilane compounds corresponding to the structural unit of formula (1) and dihalosilane compounds corresponding to the structural unit of formula (2) such as hydroxymethyl dichlorosilane, methylhydroxymethyl dichlorosilane, hydroxyethyl dichlorosilane, methylhydroxyethyl dichlorosilane, hydroxy i-propyl dichlorosilane, methylhydroxy i-propyl dichlorosilane, hydroxyoctyl dichlorosilane, methylhydroxyoctyl dichlorosilane, or the like. For the production of the polysilane compound, each of these silane compounds can be in only one kind or in a combination of two or more kinds. Further, in addition to these silane compounds, other silane compounds that can be used for the production of the polysilane compound can be used. For example, silane compounds such as dichlorosilylene, dimethylchlorosilane or the like are copolymerized and can be used. It is assumed that the end part of the resulting polysilane compound becomes a state where hydroxy is bonded to silicon atom, that is, silanol structure (Si—OH).

The compound having the structural unit of formula (1) or (2), or a combination of the structural units of formulae (1) and (2) contained in the underlayer coating forming composition for lithography of the present invention, includes concretely for example the polysilane compounds of formulae (7) to (18). In these formulae, $s_1$ to $s_3$ are numbers of structural units constituting the polysilane compound, and are integers of 1 or more, respectively, and the sum of $s_1$ to $s_3$ is 40 to 200.

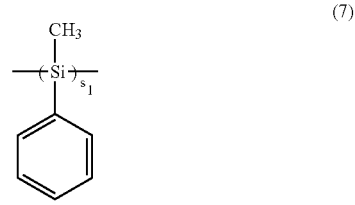

(7)

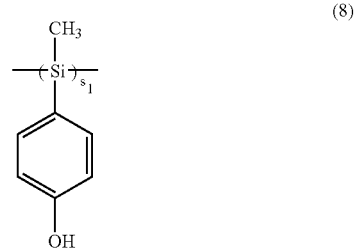

(8)

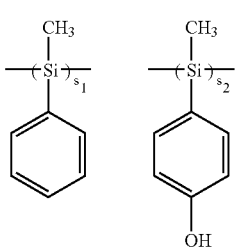
(9)

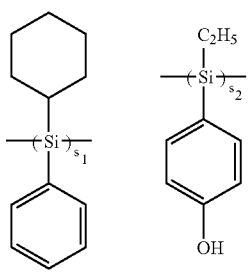
(10)

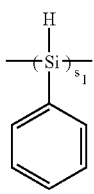
(11)

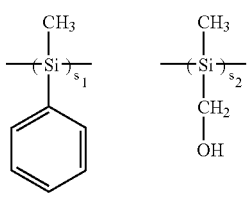
(12)

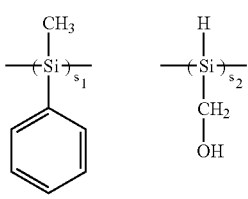
(13)

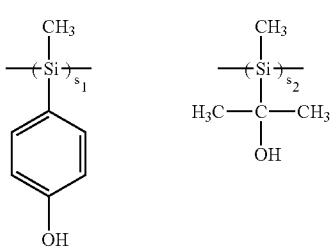
(14)

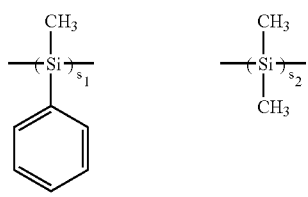
(15)

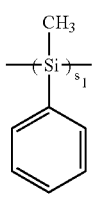
(9)

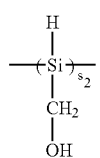
(16)

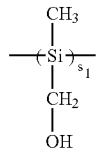
(17)

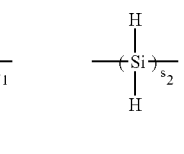
(18)

As the compound having a three-dimensional structure in the polysilane compound contained in the underlayer coating forming composition for lithography of the present invention, polysilane compounds having a combination of the structural unit of formula (3) can be used.

In formula (3), $R_3$ is substituted or unsubstituted $C_{1-10}$alkyl, or substituted or unsubstituted $C_{4-30}$cycloalkyl, or a combination thereof. The alkyl includes for example methyl, ethyl, n-hexyl, n-decyl, i-propyl, tert-butyl, or the like, and methyl or ethyl can be used preferably. The substituent for the alkyl can include hydroxy.

The cycloalkyl includes for example cyclobutyl, cyclohexyl, cyclooctyl or the like, particularly cyclohexyl is preferable. When the cycloalkyl has a substituent, the substituent includes hydroxy, hydroxyalkyl, $C_{1-10}$alkyl, $C_{1-10}$alkoxy, $C_{7-15}$alkenyl, $C_{6-14}$aryl, $C_{6-20}$aralkyl, $C_{6-20}$aryloxyalkyl, $C_{1-10}$alkoxy or the like.

The alkyl includes methyl, ethyl, n-pentyl, n-decyl, n-octadecyl, cyclohexyl, cyclodecyl, i-propyl and 2-ethylhexyl, etc.

The alkenyl includes vinyl, 2-propenyl, cyclohexenyl and 2-butenyl, etc. The aralkyl includes benzyl, 2-phenylethyl, 1-naphthylmethyl and 9-anthrylmethyl, etc.

The aryl includes phenyl, 1-naphthyl, 2-naphthyl, 1-anthryl and 9-anthryl, etc.

The aryloxyalkyl includes phenoxymethyl, phenoxyethyl, 1-naphthyloxymethyl and 9-anthryloxymethyl, etc.

The alkoxy includes methoxy, ethoxy, n-pentyloxy, n-decyloxy and n-octadecyloxy, etc.

The alkoxyalkyl includes methoxymethyl, methoxypropyl, ethoxymethyl, i-propoxymethyl and cyclohexyloxymethyl, etc.

The polysilane compounds of formula (3) are compounds having $R_3$ as substituted or unsubstituted cycloalkyl in 20 mol % or more, or 50 mol % or more in the total number of the substituents of the whole $R_3$. The parts other than cycloalkyl in the organic substituents $R_3$ are alkyl. As the cycloalkyl, cyclohexyl is particularly preferable.

It is preferable that the polysilane compounds of formula (3) have a moiety (hydroxy) for bonding to a crosslinking agent. The hydroxy may be present on alkyl or cycloalkyl as a substituent, or may be hydroxy formed by hydrolysis of alkoxy, or the silanol at the end of the polymer that is formed in the synthesis of the polymer of formula (3) may be used.

Concretely, for example the polysilane compounds of formulae (19) to (24) can be mentioned. In the formulae, $s_1$ to $s_3$ are numbers of repeating units constituting the polysilane compound, $s_1$ to $s_3$ are integers of 1 or more, respectively, and the sum of $s_1$ to $s_3$ is 40 to 200.

As example of the compound of formula (3), concretely the following polymers can be exemplified.

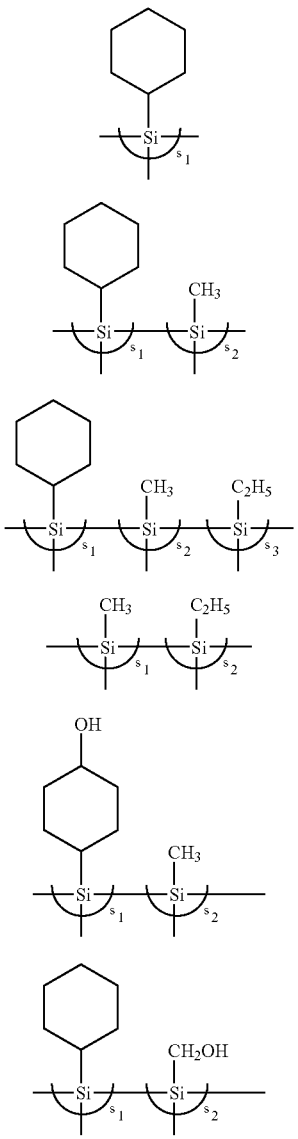

The polysilane compound contained in the underlayer coating forming composition for lithography of the present invention has for example a weight average molecular weight of 5600 to 100000, or 5600 to 50000, or 5600 to 10000.

As the polysilane compound contained in the underlayer coating forming composition for lithography of the present invention, polysilane compounds having hydroxy in the structure is preferably used. Therefore, as the polysilane compound, the followings are preferably used: for example the polysilane compound having the structural unit of formula (1) and having a silanol structure at the end, the polysilane compound having the structural units of formulae (1) and (2), the polysilane compound having the structural unit of formula (2), the polysilane compound having the structural units of formulae (1) and (2) and having a silanol structure at the end, the polysilane compound having the structural unit of formula (2) and having a silanol structure at the end, and the polysilane compound having the structural unit of formula (3) and having a silanol structure at the end. The hydroxy on the polysilane compound can react with the crosslinkable compound.

The crosslinkable compound contained in the underlayer coating forming composition for lithography of the present invention is not specifically limited. As the crosslinkable compound, compounds having two or more, for example 2 to 6, or 2 to 4 substituents that can react with hydroxy are used. The use of such a crosslinkable compound causes a crosslinking reaction when baking is carried out in order to form an underlayer coating, and consequently the formed underlayer coating has a crosslinking structure. For example, when hydroxy is present on the polysilane compound, the hydroxy and a crosslinkable compound react with each other, a crosslinking structure can be formed. Thus, the underlayer coating becomes tough due to the crosslinking structure, and has a low solubility in organic solvents used for photoresist solution that is applied on the underlayer coating. The substituents that can react with hydroxy include isocyanate, epoxy, hydroxymethylamino, and alkoxymethylamino group, etc. Therefore, compounds having two or more, for example 2 to 6 or 2 to 4 of these substituents can be used as the crosslinkable compound.

The crosslinkable compounds contained in the underlayer coating forming composition for lithography of the present invention include nitrogen-containing compounds having nitrogen atoms substituted with hydroxymethyl or alkoxymethyl. They include nitrogen-containing compounds having nitrogen atoms substituted with hydroxymethyl, methoxymethyl, ethoxymethyl, butoxymethyl and hexyloxymethyl, etc., and they have for example the nitrogen atoms of 2 to 6.

They concretely include nitrogen-containing compounds such as hexamethoxymethyl melamine, tetramethoxymethyl benzoguanamine, 1,3,4,6-tetrakis(butoxymethyl)glycoluril, 1,3,4,6-tetrakis(methoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc.

The crosslinkable compounds also include commercially available compounds such as methoxymethyl type melamine compounds manufactured by Nihon Cytec Industries Inc. (former Mitsui Cytec Co., Ltd.) (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (high condensation type, trade name: Beckamine J-300S, Beckamine P-955, Beckamine N) and the like. In addition, the crosslinkable compounds may be compounds obtained by condensation of the above-mentioned melamine compounds, urea compounds, glycoluril compounds and benzoguanamine compounds in which hydrogen atom of amino group is substituted with hydroxymethyl group or alkoxymethyl group. For example, compounds having a high molecular weight produced from a melamine compound (trade name:

Cymel 303) and a benzoguanamine compound (trade name: Cymel 1123), which are disclosed in U.S. Pat. No. 6,323,310 can be used.

Further, the crosslinkable compounds that can be used include polymer compounds produced by use of acrylamide compounds or methacrylamide compounds substituted with hydroxymethyl group or alkoxymethyl group, such as N-hydroxymethylacrylamide, N-methoxymethylmethacrylamide, N-ethoxymethylacrylamide, and N-butoxymethylmethacrylamide, etc.

Such polymers include for example poly(N-butoxymethylacrylamide), a copolymer of N-butoxymethylacrylamide and styrene, a copolymer of N-hydroxymethylmethacrylamide and methylmethacrylate, a copolymer of N-ethoxymethylmethacrylamide and benzylmethacrylate, and a copolymer of N-butoxymethylacrylamide, benzylmethacrylate and 2-hydroxypropylmethacrylate, and the like.

The crosslinkable compounds can be used singly or in a combination of two or more.

The underlayer coating forming composition for lithography of the present invention comprises a crosslinking catalyst. The use of the crosslinking catalyst accelerates a reaction of the crosslinkable compound.

As the crosslinking catalyst, for example protonic acids can be used. The crosslinking catalyst includes sulfonic acid compounds such as p-toluene sulfonic acid, trifluoromethane sulfonic acid, pyridinium-p-toluene sulfonic acid, sulfosalicylic acid and camphor sulfonic acid, etc., or carboxylic acid compounds such as salicylic acid, citric acid, benzoic acid and hydroxy benzoic acid, etc. As the crosslinking catalyst, aromatic sulfonic acid compounds can be used. Specific examples of the aromatic sulfonic acid compounds include p-toluene sulfonic acid, pyridinium-p-toluenesulfonic acid, sulfosalicylic acid, 4-chlorobenzenesulfonic acid, 4-hydroxybenzenesulfonic acid, benzenesulfonic acid, 1-naphthalenesulfonic acid, and pyridinium-1-naphthalenesulfonic acid, etc.

The crosslinking catalyst can be used singly or a combination of two or more.

The underlayer coating forming composition for lithography according to the present invention can contain a polymer compound, a photoacid generator and a surfactant if necessary, in addition to the above-mentioned components. The use of the polymer compounds makes possible to control dry etching rate (reduction in film thickness per unit time), attenuation coefficient and refractive index, etc. of the underlayer coating formed from the underlayer coating forming composition for lithography according to the present invention.

The polymer compound is not specifically limited and several polymers can be used. Condensation polymerized polymers and addition polymerized polymers, etc. can be used. Addition polymerized polymers and condensation polymerized polymers such as polyester, polystyrene, polyimide, acrylic polymer, methacrylic polymer, polyvinyl ether, phenol novolak, naphthol novolak, polyether, polyamide, polycarbonate, and the like can be used. It is preferable to use polymer compounds having aromatic ring structure acting as light absorbing moiety, such as benzene ring, naphthalene ring, anthracene ring, triazine ring, quinoline ring and quinoxaline ring, etc.

Such a polymer compound includes for example addition polymerized polymers containing addition polymerizable monomer such as benzyl acrylate, benzyl methacrylate, phenyl acrylate, naphthyl acrylate, anthryl methacrylate, anthryl methyl methacrylate, styrene, hydroxystyrene, benzylvinyl ether and N-phenyl maleimide, etc. as the structural unit, and condensation polymerized polymers such as phenol novolak and naphthol novolak, etc.

When the addition polymerized polymers are used as the polymer compound, the polymer compound may be a monopolymer or a copolymer. For the production of the addition polymerized polymers, addition polymerizable monomers are used. The addition polymerizable monomers include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, acrylonitrile, or the like.

The acrylic acid ester compounds include methyl acrylate, ethyl acrylate, n-hexyl acrylate, i-propyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxy silane and glycidyl acrylate, etc.

The methacrylic acid ester compounds include methyl methacrylate, ethyl methacrylate, n-hexyl methacrylate, i-propyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxy silane, glycidyl methacrylate, 2-phenylethyl methacrylate, hydroxyphenyl methacrylate and bromophenyl methacrylate, etc.

The acrylamide compounds include acrylamide, N-methylacrylamide, N-ethylacrylamide, N-benzylacrylamide, N-phenylacrylamide, N,N-dimethylacrylamide and N-anthrylacrylamide, etc.

The methacrylamide compounds include methacrylamide, N-methylmethacrylamide, N-ethylmethacrylamide, N-benzylmethacrylamide, N-phenylmethacrylamide, N,N-dimethylmethacrylamide and N-anthrylmethacrylamide, etc.

The vinyl compounds include vinyl alcohol, 2-hydroxyethylvinyl ether, methylvinyl ether, ethylvinyl ether, benzylvinyl ether, vinyl acetate, vinyl trimethoxy silane, 2-chloroethylvinyl ether, 2-methoxethylvinyl ether, vinyl naphthalene and vinyl antharacene, etc.

The styrene compounds include styrene, hydroxystyrene, chlorostyrene, bromostyrene, methoxystyrene, cyanostyrene and acetylstyrene, etc.

The maleimide compounds include maleimide, N-methylmaleimide, N-phenylmaleimide, N-cyclohexylmaleimide, N-benzylmaleimide and N-hydroxyethylmaleimide, etc.

When the condensation polymerized polymers are used as the polymer, the polymer includes for example a condensation polymerized polymer of a glycol compound with a dicarboxylic acid compound. The glycol compound includes diethylene glycol, hexamethylene glycol, butylene glycol or the like. The dicarboxylic acid compound includes succinic acid, adipic acid, terephthalic acid, maleic anhydride or the like. Further, the polymer includes for example polyesters, polyamides or polyimides such as polypyromellitic imide, poly(p-phenyleneterephthalic amide), polybutylene terephthalate, polyethylene terephthalate or the like.

The specific example of the polymer are polystyrene, poly(4-hydroxy)styrene, polymethacrylate, a copolymer of methylmethacrylate with 4-hydroxystyrene, poly(2-hydroxypropyl)methacrylate, a copolymer of 2-hydroxypropylmethacrylate with anthrylmethyl methacrylate, a copolymer of vinyl ether with methylvinyl ether, a copolymer of 2-hydroxypropyl methacrylate with benzyl methacrylate, a copolymer of 2-hydroxyethyl acrylate with maleimide, a copolymer of 2-hydroxypropyl methacrylate, styrene and methyl methacrylate, a copolymer of glycidyl methacrylate with 2-hydroxypropyl methacrylate, and a copolymer of styrene with 4-hydroxystyrene, or the like.

When the polymer compound contains hydroxy, the hydroxy can occur a crosslinking reaction with a crosslinkable compound.

The polymer compound that can be used has a weight average molecular weight of for example 1000 to 1000000, or 3000 to 300000, or 5000 to 200000, or 10000 to 100000.

The polymer compound can be used singly or in a combination of two or more. When the polymer compound is used, the proportion thereof is 1 to 200 mass parts, or 5 to 100 mass parts, or 10 to 50 mass parts, 20 to 30 mass parts based on 100 mass parts of the polysilane compound having a bond between silicons at the main chain.

The photoacid generator forms an acid on exposure to light of photoresists. Therefore, the photoacid generator can adjust the acidity of the underlayer coating. This is used as a measure for conforming the acidity of the underlayer coating to that of the photoresist applied thereon. In addition, the adjustment of the acidity of the underlayer coating makes possible to adjust the pattern shape of the photoresist formed thereon.

The photoacid generator contained in the underlayer coating forming composition for lithography of the present invention includes onium salt compounds, sulfoneimide compounds, and disulfonyl diazomethane compounds, etc.

The onium salt compounds include iodonium salt compounds such as diphenyl iodonium hexafluoro phosphate, diphenyl iodonium trifluoromethane sulfonate, diphenyl iodonium nonafluoro-n-butane sulfonate, diphenyl iodonium perfluoro-n-octane sulfonate, diphenyl iodonium camphor sulfonate, bis(4-tert-butylphenyl) iodonium camphor sulfonate and bis(4-tert-butylphenyl) iodonium trifluoro methane sulfonate, etc., sulfonium salt compounds such as triphenyl sulfonium hexafluoro antimonate, triphenylsulfonium nonafluoro-n-butane sulfonate, triphenyl sulfonium camphor sulfonate and triphenyl sulfonium trifluoro methane sulfonate, etc.

The sulfoneimide compounds include for example N-(trifluoromethanesulfonyloxy) succinimide, N-(nonafluoro-n-butanesulfonyloxy) succinimide, N-(camphorsulfonyloxy) succinimide and N-(trifluoromethanesulfonyloxy) naphthalimide, etc.

The disulfonyl diazomethane compounds include for example bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyl diazomethane, etc.

The photoacid generator can be used singly or in a combination of two or more. When the photoacid generator is used, the proportion thereof is for example 0.01 to 5 mass parts, or 0.1 to 5 mass parts, or 0.1 to 3 mass parts, or 0.5 to 1 mass part based on 100 mass parts of the polysilane compound having a bond between silicons at the main chain.

The surfactants are effective for inhibition of occurrence of pinholes or striation, etc., when the underlayer coating forming composition for lithography of the present invention is applied on a substrate.

The surfactants contained in the underlayer coating forming composition for lithography of the present invention include non-ionic surfactants, for example, polyoxyethylene alkyl ether compounds such as polyoxyethylene lauryl ether, polyoxyethylene stearyl ether, polyoxyethylenecetyl ether and polyoxyethylene oleyl ether, etc., polyoxyethylene alkyl aryl ether compounds such as polyoxyethylene octyl phenol ether and polyoxyethylene nonyl phenol ether, etc., polyoxyethylene/polyoxypropylene block copolymer compounds, sorbitan fatty acid ester compounds such as sorbitan monolaurate, sorbitan monopalmitate, sorbitan monostearate, sorbitan monooleate, sorbitan trioleate and sorbitan tristearate, etc., polyoxyethylene sorbitan fatty acid ester compounds such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, etc. The surfactants also include fluorine based surfactants, e.g., trade name: EFTOP EF301, EF303, EF352 (manufactured by Tohchem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); and organosiloxane polymer KP341 (manufactured by Shin-Etsu Chemical Co., Ltd.), etc. These surfactants can be used singly or in a combination of two or more. When the surfactant is used, the proportion thereof is for example 0.0001 to 5 mass parts, or 0.001 to 1 mass part, or 0.01 to 0.5 mass part based on 100 mass parts of the polysilane compound having a bond between silicons at the main chain.

Further, in the underlayer coating forming composition for lithography of the present invention, rheology controlling agents and adhesive auxiliary agents, etc. can be added. The rheology controlling agents are effective for improving the fluidity of the underlayer coating forming composition. The adhesive auxiliary agents are effective for improving the adhesiveness between the semiconductor substrate or photoresist and the underlayer coating.

As the solvents used for the underlayer coating forming composition for lithography of the present invention, any solvents can be used as far as the solvents can dissolve the above-mentioned solid contents. The solvents include for example methyl cellosolve acetate, ethyl cellosolve acetate, propylene glycol, propylene glycol monomethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, i-propyl lactate, butyl lactate, i-butyl lactate, methyl formate, ethyl formate, propyl formate, i-propyl formate, butyl formate, i-butyl formate, amyl formate, i-amyl formate, methyl acetate, ethyl acetate, amyl acetate, i-amyl acetate, hexyl acetate, methyl propionate, ethyl propionate, propyl propionate, i-propyl propionate, butyl propionate, i-butyl propionate, methyl butyrate, ethyl butyrate, propyl butyrate, i-propyl butyrate, butyl butyrate, i-butyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, and γ-butyrolactone, etc. These solvents can be used singly or in a combination of two or more.

Hereinafter, the use of the underlayer coating forming composition for lithography of the present invention is explained.

The underlayer coating forming composition for lithography of the present invention is coated by a suitable coating method, for example, with a spinner, a coater or the like, onto a substrate (for example silicon wafer substrate, silicon/silicon dioxide coated substrate, silicon nitride substrate, glass substrate, ITO substrate, polyimide substrate and low-k material-coated substrate, etc.) that is used for the production of semiconductor device, and then baked to form an underlayer coating. The condition of baking is suitably selected from baking temperature of 80 to 250° C. and baking time of 0.3 to 60 minutes. Preferably the baking temperature is 130 to 250° C. and the baking time is 0.5 to 2 minutes. The thickness of the formed underlayer coating is for example 10 to 1000 nm, or 20 to 500 nm, or 50 to 300 nm, or 100 to 200 nm.

Then, a photoresist layer is formed on the underlayer coating. The formation of the photoresist layer can be conducted by well-known process, that is, by application of a photoresist composition solution on the underlayer coating and baking. The film thickness of the photoresist is for example 50 to 10000 nm, or 100 to 2000 nm, or 200 to 1000 nm.

The photoresist to be formed on the underlayer coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular weight compound which is decomposed with an acid and increases the alkali dissolution rate of the photoresist, and a chemically-amplified photoresist consisting of a photoacid generator, a binder having a group which is decomposed with an acid and increases the alkali dissolution rate, and a low molecular weight compound which is decomposed with an acid and increases the alkali dissolution rate of the photoresist. For example, APEX-E (trade name) manufactured by Shipley Company, PAR 710 (trade name) manufactured by Sumitomo Chemical Co., Ltd.), and SEPR 430 (trade name) manufactured by Shin-Etsu Chemical Co., Ltd., etc. can be mentioned. Also, it includes fluorine atom-containing polymer type photoresist as mentioned in for example, Proc. SPIE, Vol. 3999, 330-334 (2000), Proc. SPIE, Vol. 3999, 357-364 (2000), or Proc. SPIE, Vol. 3999, 365-374 (2000).

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern. The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, an aqueous solution of amine such as ethanolamine, propylamine, ethylenediamine or the like. Further, surfactants can be added in these developers. The condition of development is suitably selected from a temperature of 5 to 50° C. and a time of 10 to 300 seconds.

Then, removal of the underlayer coating is conducted by using the photoresist pattern formed as mentioned above as a protective coating, and processing of the semiconductor substrate is conducted by using a coating consisting of the patterned photoresist and the underlayer coating as a protective coating.

Firstly, the part of the underlayer coating corresponding to the removed part of the photoresist is removed by dry etching to make the semiconductor substrate expose. The removal of the underlayer coating is conducted by use of a gas such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane and dichloroborane, etc. The dry etching for the underlayer coatings is carried out preferably with chlorine-based gas. Photoresists that are fundamentally composed of organic substances are hard to be removed by the dry etching with chlorine-based gas. On the other hand, the underlayer coating of the present invention that contains many silicon atoms is removed rapidly with chlorine-based gas. Therefore, decrease in film thickness of photoresists accompanied by dry etching of the underlayer coating can be inhibited. Consequently, the photoresists can be used in a shape of thin film. The chlorine-based gas is for example dichloroborane, trichloroborane, chlorine, carbon tetrachloride, and chloroform, etc.

Then, the processing of the semiconductor substrate is conducted by using a coating consisting of the patterned photoresist and the underlayer coating as a protective coating. It is preferable to conduct the processing of the semiconductor substrate by dry etching with fluorine-based gas. This is because the underlayer coating of the present invention that contains many silicon atoms is hard to be removed by dry etching with fluorine-based gas. The fluorine-based gas includes tetrafluoromethane ($CF_4$), perfluorocyclobutane ($C_4F_8$), perfluoropropane ($C_3F_8$), trifluoromethane, and difluoromethane ($CH_2F_2$), etc.

In addition, an organic anti-reflective coating can be formed before forming a photoresist on the underlayer coating of the present invention. The anti-reflective coating composition is not specifically limited, and an anti-reflective coating can be formed by coating an anti-reflective coating forming composition conventionally used in the lithography process with the conventional method, for example, with a spinner or a coater, and baking. In the present invention, an organic underlayer coating is formed on a substrate, and then an underlayer coating of the present invention is formed thereon, and further a photoresist can be formed thereon. This makes possible to process substrates by selecting a suitable etching gas even when the pattern width of photoresist becomes narrow and a thin photoresist is formed in order to prevent pattern fall. For example, it is possible to process the underlayer coating of the present invention by using a chlorine-based gas as etching gas that leads to a fully higher etching rate compared with photoresists. It is also possible to process the organic underlayer coating by using an oxygen-based gas as etching gas that leads to a fully higher etching rate compared with the underlayer coating of the present invention. It is further possible to process the substrate by using a fluorine-based gas as etching gas that leads to a fully higher etching rate compared with the organic underlayer coating.

The substrates on which the underlayer coating forming composition for lithography of the present invention is applied may be substrates on which an inorganic anti-reflective coating is formed by CVD method or the like, and the underlayer coating of the present invention can be also formed thereon.

The underlayer coating formed from the underlayer coating forming composition for lithography of the present invention often has absorption for light used in the process of lithography. In such a case, the underlayer coating can be used as a layer that provides preventive effect towards the light reflected by the substrate, that is, as an anti-reflective coating. Further, the underlayer coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the underlayer coating formed from the underlayer coating forming composition can be used as a filling agent that can fill via holes without gap by applying it for the substrate on which via holes are formed and which is used in dual damascene process. Further, it can be used as a flattening agent for flattening the surface of semiconductor substrate having unevenness.

Hereinafter, the present invention will be described based on examples but the present invention is not limited thereto.

EXAMPLES

Synthetic Example 1

In 27.91 g of propylene glycol monomethyl ether, 20.93 g of 2-hydroxypropyl methacrylate and 6.98 g of benzyl methacrylate were dissolved to form a reaction solution. After nitrogen was passed in the reaction solution for 30 minutes, the temperature was raised to 70° C. While the reaction solution was maintained at 70° C., 0.3 g of azobisisobutyronitrile was added therein, and the reaction solution was stirred at 70° C. for 24 hours under nitrogen atmosphere to obtain a solution of a copolymer of 2-hydroxypropyl methacrylate with benzyl methacrylate. GPC analysis showed that weight average molecular weight of the obtained polymer was 15000 (in terms of standard polystyrene).

Example 1

In 56.5 g of propylene glycol monomethyl ether acetate solution containing polymethylphenyl silane (manufactured by Osaka Gas Chemicals Co., Ltd., weight average molecular weight: 8000, number average molecular weight: 2000, this silane has silanol groups at both ends, total number of repeating units S1 in the polysilane of formula (7): about 66) composed of the structural unit of formula (7):

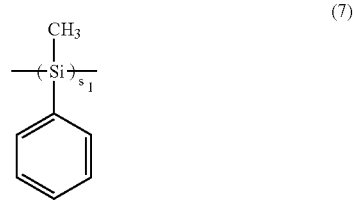

(7)

in a concentration of 7 mass %, 26.4 g of a solution containing 3.96 g of the polymer obtained in Synthetic Example 1, 24.2 g of propylene glycol monomethyl ether acetate, 2.77 g of tetramethoxymethyl glycoluril and 0.116 g of pyridinium-p-toluenesulfonic acid were added to obtain a solution of 10.0 mass %. Then, the solution was filtered through a micro filter made of polyethylene having a pore size of 0.2 μm to prepare a solution of an underlayer coating forming composition.

Example 2

In 114.5 g of propylene glycol monomethyl ether acetate, 5.0 g of polysilane compound (manufactured by Osaka Gas Chemicals Co., Ltd., trade name: SI-2020, weight average molecular weight: 5900, number average molecular weight: 1800, this compound contains 50 mol % of S1 structural units and 50 mol % of S2 structural units in the polysilane of formula (13), and has silanol groups at both ends, total number of repeating units S1 and S2 in formula (13): about 65) composed of the structural unit of formula (13):

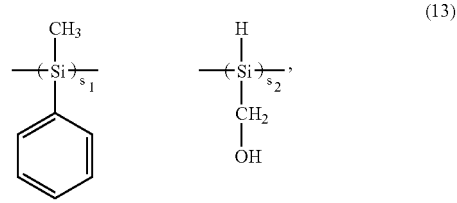

(13)

5.0 g of KN030 (manufactured by Osaka Organic Chemical Industry Ltd., this is a copolymer of naphthol novolak with cresol novolak in a copolymerized ratio of 70 mol % of naphthol novolak and 30 mol % of cresol novolak, weight average molecular weight: 1500), 2.50 g of tetramethoxymethyl glycoluril and 0.125 g of pyridinium-p-toluenesulfonic acid were added to obtain a solution of 10.0 mass %. Then, the solution was filtered through a micro filter made of polyethylene having a pore size of 0.2 µm to prepare a solution of an underlayer coating forming composition.

Example 3

In 56.5 g of propylene glycol monomethyl ether acetate solution containing polymethylphenyl silane (manufactured by Osaka Gas Chemicals Co., Ltd., weight average molecular weight: 8000, number average molecular weight: 2000, this silane has silanol groups at both ends, total number of repeating units S1 in the polysilane of formula (7): about 66) composed of the structural unit of formula (7) in a concentration of 7 mass % that is the same as that used in Example 1, 26.4 g of a solution containing 3.96 g of the polymer obtained in Synthetic Example 1, 24.2 g of propylene glycol monomethyl ether acetate, 2.77 g of hexamethoxymethyl melamine and 0.116 g of pyridinium-p-toluenesulfonic acid were added to obtain a solution of 10.0 mass %. Then, the solution was filtered through a micro filter made of polyethylene having a pore size of 0.2 µm to prepare a solution of an underlayer coating forming composition.

Example 4

In 114.5 g of propylene glycol monomethyl ether acetate, 10.0 g of polysilane compound (manufactured by Osaka Gas Chemicals Co., Ltd., trade name: SI-2020, weight average molecular weight: 5900; number average molecular weight: 1800; this compound contains 50 mol % of S1 structural units and 50 mol % of S2 structural units in the polysilane of formula (13), and has silanol groups at both ends, total number of repeating units S1 and S2 in formula (13): about 65) composed of the structural unit of formula (13) that is the same as that used in Example 2, 2.50 g of hexamethoxymethyl melamine and 0.125 g of pyridinium-p-toluenesulfonic acid were added to obtain a solution of 10.0 mass %. Then, the solution was filtered through a micro filter made of polyethylene having a pore size of 0.2 µm to prepare a solution of an underlayer coating forming composition.

Example 5

In 114.5 g of propylene glycol monomethyl ether acetate, 10.0 g of polysilane compound (manufactured by Osaka Gas Chemicals Co., Ltd., trade name: SI-4020, weight average molecular weight: 5500, number average molecular weight: 1900, this compound contains 50 mol % of S1 structural units and 50 mol % of S2 structural units in the polysilane of formula (20), and has silanol groups at both ends, total number of repeating units S1 and S2 in formula (20): about 70) composed of the structural unit of formula (20):

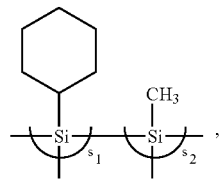

(20)

2.50 g of tetramethoxymethyl glycoluril and 0.125 g of pyridinium-p-toluenesulfonic acid were added to obtain a solution of 10.0 mass %. Then, the solution was filtered through a micro filter made of polyethylene having a pore size of 0.2 µm to prepare a solution of an underlayer coating forming composition.

Comparative Example 1

In 114.5 g of propylene glycol monomethyl ether acetate, 10.0 g of polysilane compound of formula (20) shown in Example 5 (manufactured by Osaka Gas Chemicals Co., Ltd., trade name: SI-4020, weight average molecular weight: 1900, number average molecular weight: 900, this compound contains 50 mol % of S1 structural units and 50 mol % of S2 structural units in the polysilane of formula (20), and has silanol groups at both ends, total number of repeating units S1 and S2 in formula (20): about 24), 2.50 g of tetramethoxymethyl glycoluril and 0.125 g of pyridinium-p-toluenesulfonic acid were added to obtain a solution of 10.0 mass %. Then, the solution was filtered through a micro filter made of polyethylene having a pore size of 0.2 µm to prepare a solution of an underlayer coating forming composition.

Comparative Example 2

In 114.5 g of propylene glycol monomethyl ether acetate, 10.0 g of polysilane compound of formula (20) shown in Example 5 (manufactured by Osaka Gas Chemicals Co., Ltd., trade name: SI-4020, weight average molecular weight: 18300, number average molecular weight: 2300, this compound contains 50 mol % of S1 structural units and 50 mol % of S2 structural units in the polysilane of formula (20), and has silanol groups at both ends, total number of repeating units $s_1$ and $s_2$ in formula (20): about 234), 2.50 g of tetramethoxymethyl glycoluril and 0.125 g of pyridinium-p-toluenesulfonic acid were added to obtain a solution of 10.0 mass %.

However, the resulting solution was turbid, and contains insoluble material that was not dissolved in propylene glycol monomethyl ether acetate being solvent. Although a filtration through a micro filter made of polyethylene having a pore size of 0.2 µm of the solution was tried, the filter became clogged, and thus a solution of an underlayer coating forming composition could not be prepared. This is attributed to insoluble property of the polysilane compound with a high molecular weight that was used in Comparative Example 2.

Dissolution Test in Photoresist Solvent

The solutions of underlayer coating forming compositions obtained in Examples 1 to 5 were coated on silicon wafer substrates by means of a spinner, respectively, to form applied coatings. The substrates were baked at 205° C. for 1 minute on a hot plate to form underlayer coatings (film thickness 250 nm). These underlayer coatings were dipped in ethyl lactate and propylene glycol monomethyl ether being solvents used for photoresist compositions, and as a result it was confirmed that the resulting underlayer coatings were insoluble in these solvents.

The solution of underlayer coating forming composition obtained in Comparative Example 1 was coated on silicon wafer substrates by means of a spinner to form an applied coating. The substrate was baked at 240° C. for 1 minute on a hot plate to form underlayer coatings (film thickness 250 nm). The underlayer coating was dipped in ethyl lactate and propylene glycol monomethyl ether being solvents used for photoresist compositions, and as a result it was confirmed that the resulting underlayer coating was soluble in these solvents. Due to dissolution in the solvents for photoresists, the polysilane with a low molecular weight that was used in Comparative Example 1 cannot be used as the underlayer coating forming composition of the present invention.

Test of Intermixing with Photoresist

Similarly to the above, underlayer coatings (film thickness 250 nm) were formed by use of the solutions of underlayer coating forming compositions obtained in Examples 1 to 5. On each underlayer coating was coated a photoresist solution (manufactured by Shipley Company, trade name: APEX-E) by means of a spinner. The coated wafers were heated at 90° C. for 1 minute on a hot plate to form photoresists. After exposure of the photoresists to light, post exposure bake was performed at 90° C. for 1.5 minute. After developing the photoresists, the film thickness of the underlayer coatings was measured and it was confirmed that no intermixing occurred between the underlayer coatings and the photoresists.

Measurements of Optical Parameters

Similarly to the above, underlayer coatings (film thickness 250 nm) were formed by use of the solutions of underlayer coating forming compositions obtained in Examples 1 to 5. On the underlayer coating, refractive index (n) and attenuation coefficient (k) at a wavelength of 193 nm were measured with a spectroscopic ellipsometer. The results are shown in Table 1.

TABLE 1

|  | n | k |
|---|---|---|
| Example 1 | 1.63 | 0.50 |
| Example 2 | 1.66 | 0.76 |
| Example 3 | 1.70 | 0.75 |
| Example 4 | 1.73 | 0.80 |
| Example 5 | 1.70 | 0.05 |

Test of Dry Etching Rate

Similarly to the above, underlayer coatings (film thickness 250 nm) were formed by use of the solutions of underlayer coating forming compositions obtained in Examples 1 to 5. Then, dry etching rate (decrease amount in film thickness per unit time, nm/second) on these underlayer coatings was measured with RIE system ES401 manufactured by Nippon Scientific Co., Ltd. under the condition in which tetrafluoromethane ($CF_4$) and oxygen ($O_2$) were used as dry etching gas. The results are shown in Table 2. In the table, the selection rate corresponds to dry etching rate of the underlayer coating formed from each composition of Examples in case where the dry etching rate of the photoresist GARS8105G1 (manufactured by Fuji Film Arch Co., Ltd.) under a similar condition as above is regarded as 1.0.

The underlayer coating forming compositions obtained in Examples 1 to 5 have a higher etching rate of one time or more compared with resists in a condition of $CF_4$ gas that is used when resist etching is performed. Further, the underlayer coating forming compositions have a much lower etching rate compared with resists in a condition of $O_2$ oxygen gas that is used when etching of an organic underlayer coating formed below the composition of the present invention is performed, and thus show a good hardmask property.

TABLE 2

| | Kind of Gas | |
|---|---|---|
| | $CF_4$ Selection Rate | $O_2$ Selection Rate |
| Example 1 | 1.1 | 0.05 |
| Example 2 | 1.3 | 0.03 |
| Example 3 | 1.3 | 0.02 |

TABLE 2-continued

| | Kind of Gas | |
|---|---|---|
| | $CF_4$ Selection Rate | $O_2$ Selection Rate |
| Example 4 | 1.3 | 0.02 |
| Example 5 | 1.4 | 0.05 |

What is claimed is:

1. An underlayer coating forming composition for lithography that is used in a lithography process of manufacture of semiconductor device, comprising:

a polysilane compound having:
structural units of formulae (1) and (2):

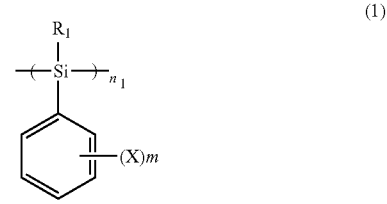

(1)

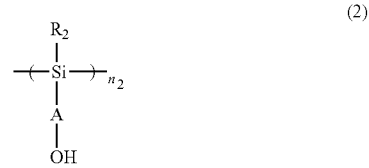

(2)

where:
X is a $C_{1-10}$ alkyl, $C_{1-10}$ alkoxy, $C_{7-15}$ aralkyl, $C_{6-14}$ aryl, $C_{7-15}$ aryloxyalkyl, hydroxy, $C_{2-10}$ alkenyl, or $C_{2-10}$ alkoxyalkyl group;

m is an integer of 1 to 5, and when m is 2 to 5, the Xs are identical to or different from each other;

$n_1$ and $n_2$ are numbers of repeating units where $n_1$ and $n_2$ are integers of 1 or more, and $n_1+n_2$ is 40 to 200;

$R_1$ is a hydrogen atom or a $C_{1-10}$ alkyl;

$R_2$ is a hydrogen atom or a $C_{1-10}$ alkyl; and

A is a $C_{1-10}$ alkylene, or a structural unit of formula (3):

(3)

where:
$n_1$ is a number of repeating units ranging from 40 to 200; and $R_3$ is substituted or unsubstituted cycloalkyl, or a combination of substituted or unsubstituted $C_{1-10}$alkyl and substituted or unsubstituted cycloalkyl, wherein the substituted or unsubstituted cycloalkyl is present in a proportion of 20 mol % or more in all of $R_3$, a crosslinkable compound that is a nitrogen-containing compound having two or more nitrogen atoms substituted with hydroxymethyl or alkoxymethyl, a crosslinking catalyst, and a solvent.

2. The underlayer coating forming composition for lithography according to claim 1, wherein the crosslinking catalyst is an aromatic sulfonic acid compound.

3. The underlayer coating forming composition for lithography according to claim 1, further comprising a photoacid generator.

4. An underlayer coating formed by coating the underlayer coating forming composition for lithography according to claim 1 on a substrate for use in manufacture of semiconductor device, and baking it at 150 to 250° C. for 0.5 to 2 minutes.

5. A method for forming photoresist pattern for use in manufacture of semiconductor device, comprising the steps:

coating the underlayer coating forming composition for lithography as described in claim 1 on a substrate for use in manufacture of semiconductor device, and baking it to form an underlayer coating;

forming a photoresist layer on the underlayer coating;

exposing the substrate covered with the underlayer coating and the photoresist layer to light; and developing after the exposure to light.

6. The method for forming photoresist pattern according to claim 5, wherein the exposure to light is performed with ArF excimer laser beam (wavelength 193 nm).

* * * * *